US011257662B2

(12) United States Patent
Kitamura et al.

(10) Patent No.: US 11,257,662 B2
(45) Date of Patent: Feb. 22, 2022

(54) ANNULAR MEMBER, PLASMA PROCESSING APPARATUS AND PLASMA ETCHING METHOD

(71) Applicant: Tokyo Electron Limited, Tokyo (JP)

(72) Inventors: Shingo Kitamura, Miyagi (JP); Koichi Kazama, Miyagi (JP); Masahiro Ogasawara, Miyagi (JP); Susumu Nogami, Miyagi (JP); Tetsuji Sato, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/545,185

(22) Filed: Aug. 20, 2019

(65) Prior Publication Data

US 2020/0066496 A1 Feb. 27, 2020

(30) Foreign Application Priority Data

Aug. 22, 2018 (JP) .............................. JP2018-155796

(51) Int. Cl.
*H01J 37/32* (2006.01)
*H01L 21/687* (2006.01)
*H01L 21/3213* (2006.01)

(52) U.S. Cl.
CPC .. *H01J 37/32642* (2013.01); *H01J 37/32715* (2013.01); *H01L 21/32137* (2013.01); *H01L 21/32139* (2013.01); *H01L 21/68735* (2013.01); *H01L 21/68757* (2013.01); *H01J 2237/3341* (2013.01)

(58) Field of Classification Search
CPC ........... H01J 37/32642; H01J 21/68735; H01J 37/32715; H01J 2237/3341; H01J 37/32; H01L 21/68757; H01L 21/32139; H01L 21/32137; H01L 21/3085; H01L 21/3065; H01L 21/67109; H01L 21/6831; H01L 21/68721; H01L 21/68735; C23C 16/4585

See application file for complete search history.

(56) References Cited

U.S. PATENT DOCUMENTS 6,022,809 A * 2/2000 Fan .................... H01J 37/32091
156/345.3
2003/0106646 A1* 6/2003 Ma ..................... H01J 37/32642
156/345.51

(Continued)

FOREIGN PATENT DOCUMENTS

| CN | 103964686 A | * 8/2014 |
| JP | 2004-311972 | 11/2004 |
| JP | 2017-050509 | 3/2017 |

OTHER PUBLICATIONS

MatWeb Ceramics Material Data Sheets Table 2. Ceramics Material Properties (Metric Units). Retrieved from Knovel https://app.knovel.com/hotlink/itble/rcid:kpMWCMDS06/id:kt00CXS5E1/matweb-ceramics-material/table-2-ceramics-materia (Year: 2018).*

(Continued)

*Primary Examiner* — Rakesh K Dhingra
*Assistant Examiner* — Laureen Chan
(74) *Attorney, Agent, or Firm* — IPUSA, PLLC

(57) ABSTRACT

An annular member is disposed to surround a pedestal for receiving a substrate in a plasma processing apparatus. The annular member contains quartz and silicon. A content percentage of the silicon in the quartz and the silicon is 2.5% or more and 10% and less by weight.

8 Claims, 5 Drawing Sheets

(56) References Cited

U.S. PATENT DOCUMENTS

| | | | | |
|---|---|---|---|---|
| 2004/0241995 | A1* | 12/2004 | Yamanaka | H01J 37/32082 438/689 |
| 2006/0157198 | A1* | 7/2006 | Furuse | H01J 37/3255 156/345.24 |
| 2011/0126984 | A1* | 6/2011 | Kang | H01J 37/32091 156/345.51 |
| 2015/0001180 | A1* | 1/2015 | Doan | H01J 37/32449 216/67 |

OTHER PUBLICATIONS

English Machine Translation of He et al. (CN103964686A) retrieved from ESPACENET on May 7, 2021 (Year: 2021).*
Béjina et al. ("Silicon self-diffusion in quartz and diopside measured by nuclear micro-analysis methods") (Year: 1995).*

* cited by examiner

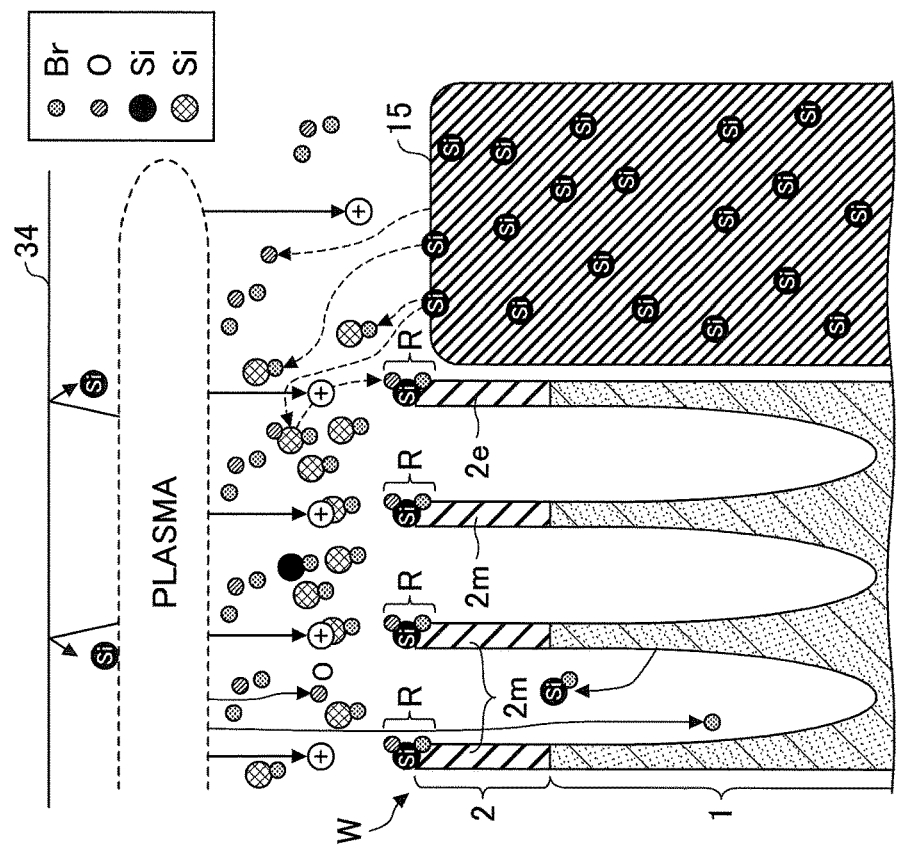
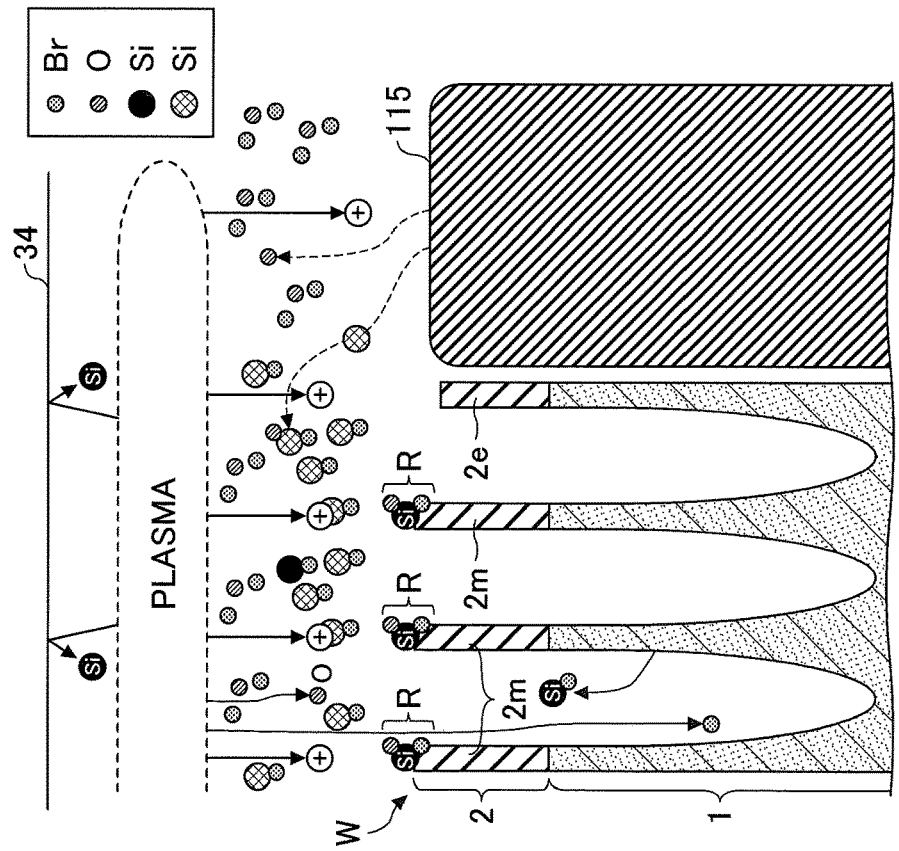

27 # ANNULAR MEMBER, PLASMA PROCESSING APPARATUS AND PLASMA ETCHING METHOD

CROSS-REFERENCE TO RELATED APPLICATION

The present application is based on and claims priority to Japanese Priority Application No. 2018-155796 filed on Aug. 22, 2018, the entire contents of which are hereby incorporated herein by reference.

BACKGROUND OF THE INVENTION

1. Field of the Invention

The present disclosure relates to an annular member, a plasma processing apparatus and a plasma etching method.

2. Description of the Related Art

The substrate processing apparatus described in Japanese Patent Application Publication No. 2017-50509 includes an edge ring made of quartz, for example.

SUMMARY OF THE INVENTION

The present disclosure provides a technique for inhibiting a decrease in remaining amount of an edge portion of a mask on a film to be etched.

According to one embodiment of the present disclosure, an annular member is disposed to surround a pedestal for receiving a substrate in a plasma processing apparatus. The annular member contains quartz and silicon. A content percentage of the silicon in the quartz and the silicon is 2.5% or more and 10% and less by weight.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 2A and 2B are diagrams illustrating a state of an edge portion of a mask according to an embodiment;

DETAILED DESCRIPTION OF THE PREFERRED EMBODIMENTS

Figure 1:
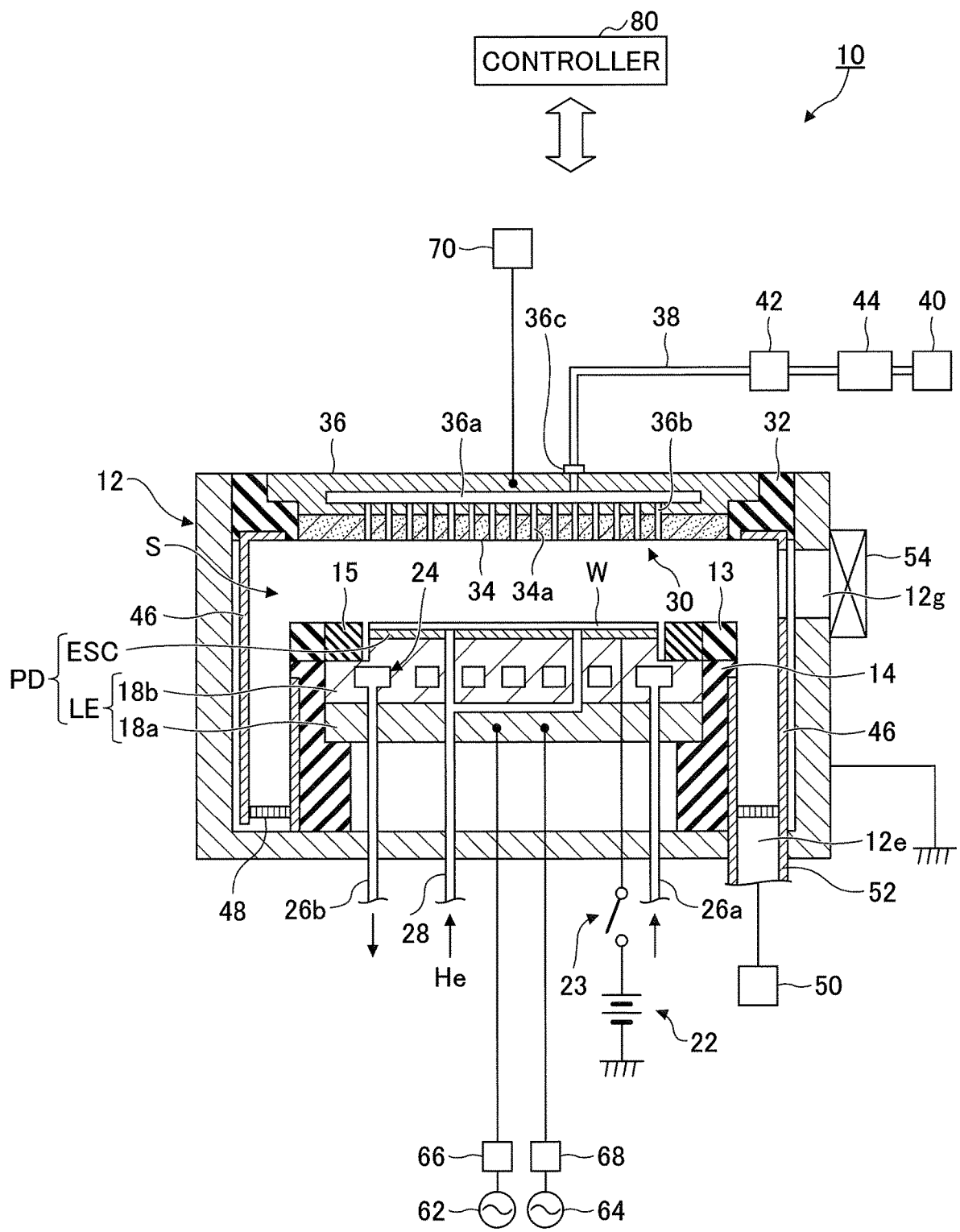
FIG. 1 a diagram illustrating an example of a plasma processing apparatus according to an embodiment.

Embodiments for carrying out the present disclosure are described below with reference to accompanying drawings. In the present specification and drawings, the overlapping description of the components having substantially the same configuration is omitted by putting the same reference numerals.

[Configuration of Plasma Processing Apparatus]

First, an example of a plasma processing apparatus 10 according to an embodiment will be described with reference to FIG. 1. The plasma processing apparatus 10 includes a processing chamber 12 having an approximately cylindrical shape. The processing chamber 12 is, for example, made of aluminum, and an inner wall surface of the processing chamber 12 is subjected to an anodization process. The processing chamber 12 is grounded.

An approximately cylindrical shaped support 14 is provided on a bottom portion of the processing chamber 12. The support 14 is, for example, made of an insulating material. The support 14 extends vertically from the bottom portion of the processing chamber 12 in the processing chamber 12. In addition, a pedestal PD is disposed in the processing chamber 12. The pedestal PD is supported by the support 14.

The pedestal PD holds a wafer W on its top surface. The pedestal PD includes a lower electrode LE and an electrostatic chuck ESC. The lower electrode LE includes a first plate 18a and a second plate 18b. The first and second plates 18a and 18b are made of a metal such as aluminum, and have an approximately disc shape. The second plate 18b is dispose on the first plate 18a and is electrically connected to the first plate 18a.

An electrostatic chuck ESC is disposed on the second plate 18b. The electrostatic chuck ESC has a structure in which an electrode, which is a conductive film, is disposed between a pair of insulating layers or insulating sheets. A direct-current power supply 22 is electrically connected to an electrode of the electrostatic chuck ESC via a switch 23. The electrostatic chuck ESC attracts the wafer W by electrostatic force such as Coulomb force generated by a direct-current voltage from the direct-current power supply 22. This allows the electrostatic chuck ESC to hold the wafer W.

An edge ring 15 is disposed on the periphery of the second plate 18b so as to surround the edge of the wafer W and the electrostatic chuck ESC. The edge ring 15 has an approximately annular plate shape. The edge ring 15 is a member that surrounds the wafer W and serves to maintain a uniform plasma distribution. The edge ring 15 is made of quartz containing silicon. The edge ring 15 is also referred to as a focus ring. A cover ring 13 is disposed to surround an outer circumference of the edge ring 15 and on an upper surface of the support 14. The cover ring 13 is made of an insulator such as quartz.

The second plate 18b includes a refrigerant flow passage 24 thereinside. The refrigerant flow passage 24 is formed as a temperature control mechanism. A refrigerant is supplied to the refrigerant flow passage 24 through a pipe 26a from a chiller unit disposed outside the processing chamber 12. The refrigerant supplied to the refrigerant flow passage 24 is returned to the chiller unit through a pipe 26b. In this way, the refrigerant is circulated between the refrigerant flow passage 24 and the chiller unit. By controlling the temperature of the refrigerant, the temperature of the wafer W supported by the electrostatic chuck ESC is controlled.

Also, a gas supply line 28 is provided in the plasma processing apparatus 10. The gas supply line 28 supplies a heat transfer gas, for example, He gas, from a heat transfer gas supply mechanism to a location between the top surface of the electrostatic chuck ESC and the back surface of the wafer W.

Moreover, the plasma processing apparatus 10 includes an upper electrode 30. The upper electrode 30 is located above the pedestal PD so as to face the pedestal PD. Accordingly, the lower electrode LE and the upper electrode 30 are disposed substantially parallel to each other. Between the top electrode 30 and the mounting table PD, a processing space S is provided to perform a plasma process on the wafer W.

The top electrode 30 is supported by the ceiling portion of the processing chamber 12 via an insulating shield member 32. In one embodiment, the top electrode 30 may be configured such that the distance in the vertical direction from the top surface of the pedestal PD, that is, the wafer placement surface, is variable. The top electrode 30 may include a top plate 34 and a support 36. The top plate 34 faces the processing space S, and a plurality of gas discharge holes 34a are provided in the top plate 34. The top plate 34 is made of silicon in one embodiment.

The support 36 detachably supports the top plate 34, and may be made of a conductive material such as aluminum. The support 36 may have a water-cooled structure. A gas diffusion chamber 36a is provided inside the support 36. A plurality of gas flow holes 36b in communication with the gas discharge holes 34a extends downward from the gas diffusion chamber 36a. A gas inlet 36c is formed in the support 36 to lead the process gas to the gas diffusion chamber 36a, and a gas supply pipe 38 is connected to the gas inlet 36c.

The gas supply pipe 38 is connected to a gas source group 40 via a valve group 42 and a flow controller group 44. The gas source group 40 includes a plurality of gas sources. In an example, the gas source group 40 includes a source of a fluorocarbon gas, a source of an inert gas, and a source of an oxygen-containing gas. Examples of fluorocarbon gases include any fluorocarbon gas such as $CF_4$ gas, $C_4F_8$ gas, and $C_4F_6$ gas. The source of the inert gas is, in one embodiment, a source of a noble gas. Any noble gas can be used, such as Ar gas, He gas, Ne gas, Kr gas and Xe gas. The source of the oxygen-containing gas may, in one example, be a source of oxygen gas ($O_2$ gas).

The valve group 42 includes a plurality of valves, and the flow controller group 44 includes a plurality of flow controllers such as mass flow controllers. The plurality of gas sources of the gas source group 40 are each connected to the gas supply pipe 38 via a corresponding valve of the valve group 42 and a corresponding flow controller of the flow controller group 44.

In the plasma processing apparatus 10, a deposition shield 46 is detachably disposed along the inner wall of the processing chamber 12. A deposition shield 46 is also disposed on the outer periphery of the support 14. Deposition shield 46 prevents an etching by-product (deposit) from adhering to the processing chamber 12. The deposition shield 46 can be formed by coating an aluminum material with ceramics such as $Y_2O_3$.

An exhaust plate 48 is disposed on the bottom side of the processing chamber 12 and between the support 14 and the side wall of the processing chamber 12. A plurality of through holes is formed in the exhaust plate 48 that penetrate through the exhaust plate 48 in the thickness direction. The exhaust plate 48 may be formed, for example, by coating an aluminum material with ceramics such as $Y_2O_3$. An exhaust port 12e is disposed under the exhaust plate 48 and in the processing chamber 12. An exhaust device 50 is connected to the exhaust port 12e via an exhaust pipe 52. The exhaust device 50 includes a pressure regulating valve and a vacuum pump such as a turbomolecular pump, and can decrease the pressure of the space in the processing chamber 12 to a desired degree of vacuum. Further, the side wall of the processing chamber 12 has a transfer port 12g of the wafer W, and the transfer port 12g can be opened and closed by a gate valve 54.

The plasma processing apparatus 10 further includes a first radio frequency power supply 62 and a second radio frequency power supply 64. The first radio frequency power supply 62 is a power source that generates radio frequency (HF) power for plasma generation, and generates radio frequency power at a frequency of 27 to 100 MHz, for example. The first radio frequency power supply 62 is connected to the lower electrode LE via a matching box 66. The matching box 66 includes a circuit for matching the output impedance of the first radio frequency power supply 62 with the input impedance of the load side (lower electrode LE side). The first radio frequency power supply 62 may be connected to the upper electrode 30 via the matching box 66.

The second radio frequency power supply 64 is a power source that generates a radio frequency bias (LF) voltage to draw ions to the wafer W, and generates radio frequency bias voltage in a range of 400 kHz to 13.56 MHz, for example. The second radio frequency power supply 64 is connected to the lower electrode LE via a matching box 68. The matching box 68 includes a circuit for matching the output impedance of the second radio frequency power supply 64 with the input impedance of the load side (lower electrode LE side).

The plasma processing apparatus 10 further includes a power supply 70. The power supply 70 is connected to the upper electrode 30. The power supply 70 applies a voltage to the upper electrode 30 for attracting positive ions present in the processing space S to the top plate 34. In one example, the power supply 70 is a direct-current power source to generate a negative direct-current voltage. In another example, the power supply 70 may be an alternating-current power source that generates a relatively low frequency alternating-current voltage. The voltage applied from the power supply 70 to the upper electrode 30 can be a voltage of −150 V or less. That is, the voltage applied to the upper electrode 30 by the power supply 70 may be a negative voltage having an absolute value of 150 V or more. When such a voltage is applied from the power supply 70 to the upper electrode 30, positive ions present in the processing space S collide with the top plate 34. This releases secondary electrons and/or silicon from the top plate 34. The emitted silicon binds to fluorine active species present in the processing space S to reduce the amount of fluorine active species. Part of the emitted silicon is deposited on a mask on the wafer W and becomes a protective film of the mask.

In one embodiment, the plasma processing apparatus 10 may further include a controller 80. The controller 80 is a computer that includes a CPU (Central Processing Unit), a storage unit, an input device, a display device and the like, and controls each portion of the plasma processing apparatus 10. In the controller 80, the input device allows an operator to input commands and the like to manage the plasma processing apparatus 10, and the operation status of the plasma processing apparatus 10 can be visualized and displayed by the display device. Further, the storage unit of the controller 80 stores a control program to allow the CPU to control various processes such as etching performed by the plasma processing apparatus 10, or a program to allow each part of the plasma processing apparatus 10 to perform a process according to provided process conditions, that is, a process recipe.

[Edge Ring]

Referring to FIGS. 1 and 2, the edge ring 15 is described below. In FIGS. 1 and 2, the edge ring 15 is disposed around the pedestal PD on which a wafer W is placed in the plasma processing apparatus 10. The edge ring is made of quartz containing a predetermined proportion (content) of silicon.

FIG. 2A is an enlarged view illustrating an edge ring 115 according to a comparative example, a state in a processing space S, and a state on a wafer W. FIG. 2B is an enlarged view illustrating the edge ring 15 according to an embodiment, a state in the processing space S, and a state on the wafer W. The edge portion of the wafer W is defined as a portion in a range of 135 mm to 150 mm in radius from the center of the wafer W, which is defined as 0 mm, having a diameter of 300 mm.

A principal material of the edge ring 115 according to the comparative example is quartz ($SiO_2$). The edge ring 115 is annularly disposed around the wafer W. A silicon oxide ($SiO_2$) mask 2 is formed on the silicon substrate 1 in the wafer W. For example, in the example of FIG. 2A, the gas source group 40 provides $CF_4$ gas as a fluorocarbon gas, Ar gas as an inert gas, and $O_2$ gas as an oxygen-containing gas. Radio frequency power (HF) supplied from the first radio frequency power supply 62 generates plasma from the gas, and radio frequency power (LF) supplied from the second radio frequency power supply 64 attracts ions in the plasma to the wafer W. Thus, the silicon substrate 1 is etched into a pattern of mask 2. Additionally, HBr gas, $NF_3$ gas and $O_2$ gas are supplied, and Br reacts with Si of silicon substrate 1 to form a volatile gas and the etching proceeds.

During the etching, an etching by-product (depot) is deposited on the mask 2 and forms a protective film R of the mask 2. The etching by-product includes Si deposits generated by etching the silicon substrate 1, and Si deposits released from the top plate 34 caused by Br, O and positive ions in the plasma that have collided with the top plate 34.

As illustrated in FIG. 2A, the edge portion 2e of the mask 2 has less remaining amount of the mask than that of the inner portions 2m of the mask 2. The reason for this is that the inner portion 2m has more abundant silicon deposits caused by etching the silicon substrate 1 of the wafer W than those of the edge portion, and the silicon deposits form the protective film R by being deposited on the inner portions 2m, thereby reducing consumption of the mask 2. In contrast, in the edge portion 2e, the Si deposits caused by etching the silicon substrate 1 is not as abundant as those in the inner portions 2m.

In the meantime, in the process of etching the silicon substrate 1, it is preferable to use quartz (SiO2) with a high selectivity ratio to silicon to etch silicon as the material of the edge ring 15. However, due to the high selectivity ratio, a minute amount of Si deposits is generated from the edge ring 15 made of quartz in the etching process. As a result, in the edge portion 2e, the formation of the protective film R by the etching by-product is insufficient, and the consumption of the mask 2 increases, that is, the remaining mask (remaining amount of the mask) becomes insufficient. As a result, uniformity of the etching across the wafer W is negatively affected, and the etching characteristics become non-uniform.

Therefore, in the present embodiment, a predetermined content percentage of silicon is added to quartz forming the edge ring 15 to be able to sufficiently form the protective film R even in the edge portion 2e as illustrated in FIG. 2B. That is, the edge ring 15 according to the present embodiment contains quartz and silicon, and the percentage of the weight of silicon to the total weight of quartz and silicon in the edge ring 15, that is, the content percentage of silicon in quartz and silicon is made 2.5% or more and 10% or less.

Silicon is added to quartz while or after processing quartz into the edge ring 15. For example, a method of adding silicon to quartz while forming quartz into an annular shape and then firing quartz containing silicon is cited as an example of a method of manufacturing the edge ring 15 by adding silicon to quartz. In addition, a method of adding silicon into quartz after making the annular quartz is cited as an example.

In the edge ring 15 prepared in the above-described manner, Si and O that form quartz covalently bond with each other, and silicon is contained in a gap between Si and O in a form of single crystal silicon or ionized silicon. Alternatively, the covalent state of Si with O may have a defective portion, and single crystal silicon or ionized silicon is disposed to compensate for the defective portion.

For example, in the example of FIG. 2B, the gas source group 40 supplies $CF_4$ gas as a fluorocarbon gas, Ar gas as an inert gas, and $O_2$ gas as an oxygen-containing gas. Plasma is generated by the radio frequency power (HF) supplied from the first radio frequency power supply 62, and ions are attracted to the wafer W by the radio frequency power (LF) supplied from the second radio frequency power supply 64, thereby etching the silicon substrate 1 into a pattern of the mask 2. In addition, HBr gas, $NF_3$ gas and $O_2$ gas are supplied, and Br reacts with Si of the silicon substrate 1 and forms a volatile gas, thereby accelerating the etching.

During the etching, an etching by-product (depot) is deposited on the mask 2 and forms a protective film R of the mask 2. The etching by-product includes Si deposits generated by etching the silicon substrate 1, and Si deposits released from the top plate 34 caused by a collision of Br, O and positive ions in the plasma with the top plate 34. However, in the edge portion 2e, the amount of Si deposits emitted from the silicon substrate 1 caused by the etching and Si deposits emitted from the top plate 34 that are contained in the etching by-product are less than that of the inner portion 2m.

However, in the present embodiment, as illustrated in FIG. 2B, ions in the plasma collide with the edge ring 15, and thereby Si contained in the edge ring 15 is released from the edge ring 15 and flies to the edge portion 2e of the wafer W. Thus, the protective film R can be formed by depositing Si deposits from the edge ring 15 onto the edge portion 2e on the mask 2. Accordingly, even in the edge portion 2e of the mask 2, the consumption of the mask 2 is reduced, and the formation of the protective film R without variation between the inner portion 2m and the edge portion 2e can be achieved. As a result, the uniformity of the etching across the wafer W can be improved and the etching characteristics can be made uniform.

Here, the content percentage of silicon in quartz and silicon in the edge ring 15 (=silicon/(quartz+silicon)) is not less than 2.5% and not more than 10% by weight percent. The remaining mask at the edge portion 2e of the mask 2 can be adjusted to any thickness by changing the content percentage of silicon to quartz and silicon in the edge ring 15.

Instead of adding silicon into the edge ring 15, experiments of exposing silicon to the surface of the edge ring 15 were performed. As a result of the experiment, the remaining mask at the edge portion 2e was sufficiently restored.

At the edge ring 15 of this embodiment, silicon is added into quartz of the edge ring 15. This slowly consumes the quartz of the edge ring 15, thereby gradually exposing the Si inside the edge ring 15. Thus, according to the edge ring 15 of the present embodiment, a certain amount of silicon can be gradually exposed, and silicon can be adhered to the edge portion 2e of the mask 2 to form the protective film R without significantly changing the consumption rate of the edge ring 15.

In the present embodiment, the mask 2 is $SiO_2$, but is not limited thereto, and may be tungsten silicon or tungsten nitride silicon. In the present embodiment, the film to be etched is silicon substrate 1 (silicon), but is not limited thereto, any may also be tungsten silicon or tungsten nitride silicon. In this case, a mask 2 of $SiO_2$ is formed on the tungsten silicon or tungsten nitride silicon, and an etching by-product of silicon, tungsten silicon, or tungsten nitride silicon is deposited on the edge portion 2e of the mask 2.

Examples of Effects

Figure 3A:
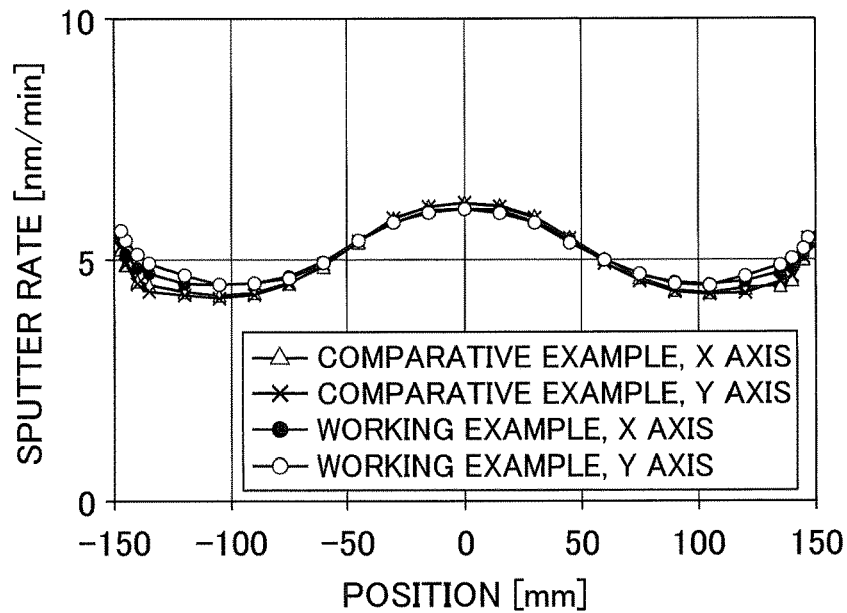
FIGS. 3A and 3B are diagrams illustrating an example of an edge ring effect according to an embodiment.
Figure 3B:
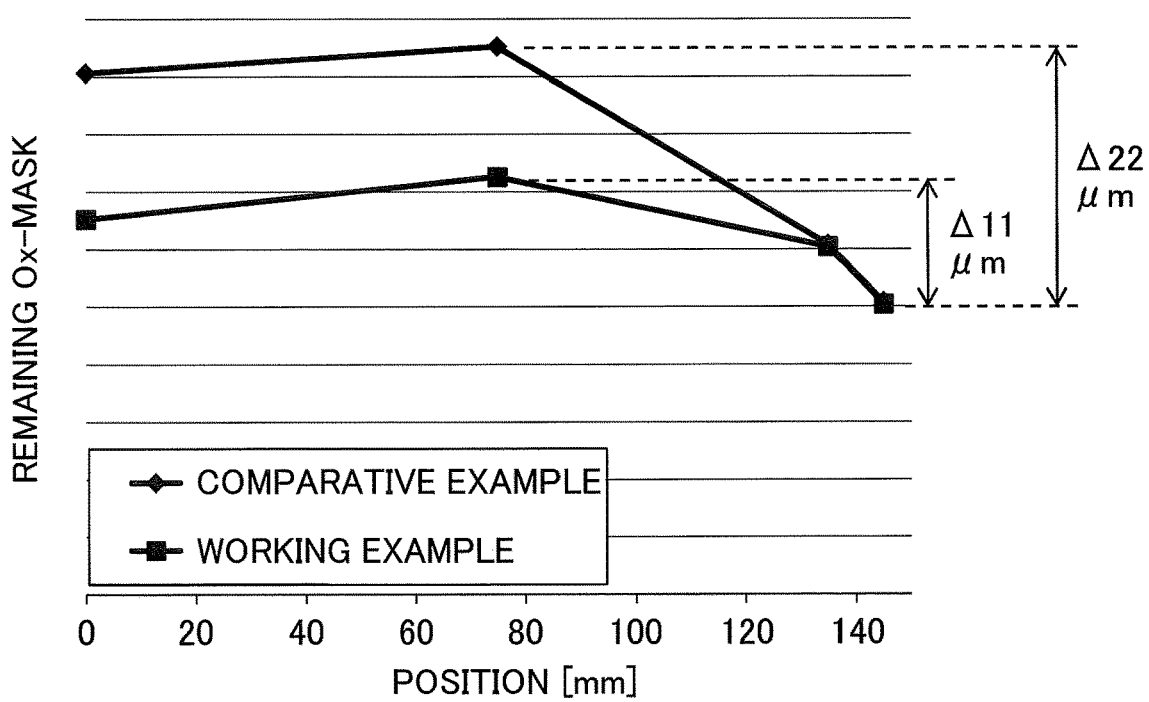

FIGS. 3A and 3B show an example of an effect of placing an edge ring 15 according to an embodiment. The horizontal axis of FIG. 3A shows a diametrical position when the center of a 300 mm wafer is set at 0 mm, and the vertical axis shows a sputtering rate (nm/min) at each position.

The horizontal axis of FIG. 3B shows the radial position when the center of a 300 mm wafer is set at 0 mm, and the vertical axis shows a remaining amount (remaining mask) of the mask 2 of $SiO_2$ at each position. The following shows each process condition of the edge ring 15 containing silicon in the quartz of a working example of FIGS. 3A and 3B and the quartz edge ring 115 (see FIG. 2) of a comparative example.

Working Example: Process Conditions

First Step
Pressure 20 mT (2.67 Pa)
HF 350 (W)
LF 1500 (W)
Gas type CF4, O2, Ar
Step 2
Pressure 80 mT (10.67 Pa)
HF 300 (W)
LF 4500 (W)
Gas species HBr, O2, NF3
Third Step
Pressure 80 mT
HF 300 (W)
LF 4500 (W)
Gas species HBr, $O_2$, $NF_3$
Fourth Step
Pressure 80 mT
HF 300 (W)
LF 4500 (W)
Gas species HBr, $O_2$, $NF_3$ Comparative Example: Process Condition First Step
Pressure 20 mT (2.67 Pa)
HF 350 (W)
LF 1500 (W)
Gas type CF4, O2, Ar
Step 2
Pressure 80 mT (10.67 Pa)
HF 300 (W)
LF 4500 (W)
Gas species HBr, $O_2$, $NF_3$
Third Step
Pressure 80 mT
HF 300 (W)
LF 4500 (W)
Gas species HBr, $O_2$, $NF_3$
Fourth Step
Pressure 80 mT
HF 300 (W)
LF 4500 (W)
Gas species HBr, $O_2$, $NF_3$ Examining the results in FIG. 3A revealed, the sputtering rate hardly differs between the results of one embodiment (sputtering rate in the Y-axis direction perpendicular to the X-axis direction and the X-axis) and the results of the comparative example (sputter rate in the X-axis direction and the Y-axis direction). Thus, the results indicate that the radio frequency power efficiency of HF and LF and the physical state of the ion collision with the wafer W and edge ring 15. In other words, the remaining mask of the wafer W shown in FIG. 3B has a large chemical variability factor.

That is, in the comparative example of FIG. 3B, the change in the remaining mask from the center of the wafer W (0 mm) to about 70 mm in the radial direction was small, whereas the change in the remaining mask from the point at 70 mm distant from the center to the edge portion 2e of the wafer W (about 140 mm from the center of the wafer W) was great. The remaining mask at a point approximately 140 mm distant from the center of the wafer W in the radial direction decreased by 22 μm than the remaining mask at a point approximately 70 mm distant from the center of the wafer W.

In contrast, in one embodiment of FIG. 3B, the change in the remaining mask from the center of the wafer W to a point about 70 mm distant from the center was small, and the change in the remaining mask from the point 70 mm distant from the center to a point about 140 mm distant from the center was also half of that in the comparative example. More specifically, the remaining mask located about 140 mm distant from the center of the wafer W in the radial direction decreased by 11 μm than the remaining mask located about 70 mm distant from the center of the wafer W. Due to the supply of Si from the edge ring 15 according to the present embodiment, the variation of the remaining mask was improved to half of the comparative example.

As discussed above, the results indicate that the remaining amount of mask 2 in the working example is 11 μm higher than that in the comparative example, and that Si contained in the edge ring 15 is deposited on the edge portion 2e of the mask 2 during the etching process to protect the mask 2.

Figure 4:
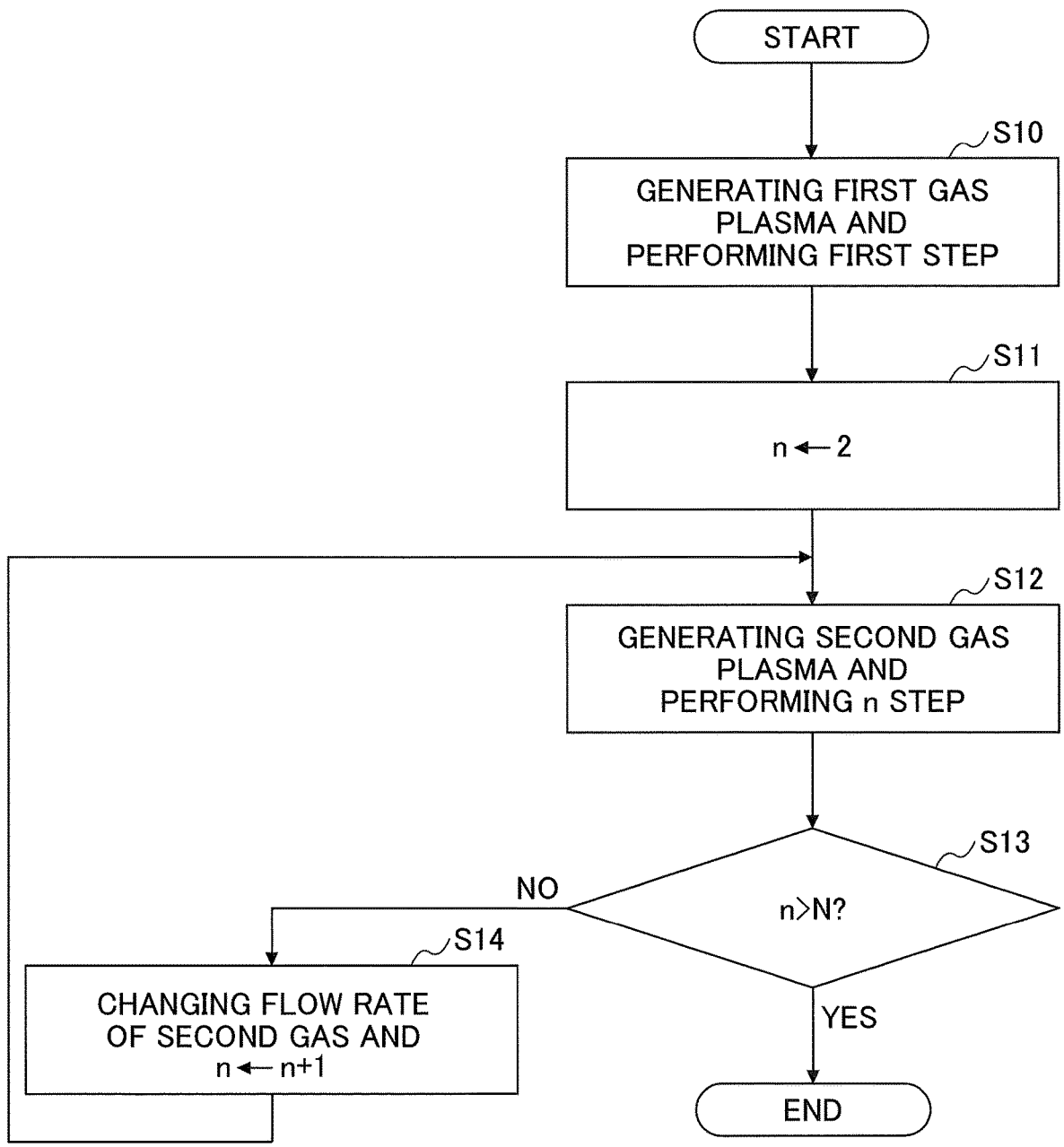
FIG. 4 is a flow chart illustrating an example of an etching processing method according to an embodiment.

The working example and the etching process of the comparative example performed to obtain the results of FIGS. 3A and 3B under the above-described process conditions will be briefly described with reference to FIG. 4. In the etching process of the working example and the comparative example, to begin with, a first gas ($CF_4$, $O_2$, Ar) is supplied while generating plasma by supplying radio frequency power of HF and LF to the first gas, and a first step of etching the silicon substrate 1 into the pattern of the mask 2 is performed (S10).

Then, the variable n is set to 2 (S11); a second gas (HBr, $O_2$, $NF_3$) is supplied; plasma is generated by supplying radio frequency power of HF and LF to the second gas; and the n (=2) step is performed in which the silicon substrate 1 is etched into a pattern of the mask 2 (S12).

Next, it is determined whether the variable n is larger than the predetermined number of repetitions N (for example, 3) (S13). If it is determined that the variable n (=2) is less than or equal to the number of repetitions N, the flow rate of the second gas is changed depending on the process conditions, and one is added to the variable n (S14). Then, the process returns to S12.

In S12, the n (=3) step is performed to generate plasma from the second gas and etch the silicon substrate 1 into the pattern of the mask 2 (S12).

The processes of S12 to S14 are repeated until the variable n is larger than the number of repetitions N. When it is determined that the variable n is larger than the number of repetitions N in S13, the process ends.

As described above, according to the edge ring 15 of the present embodiment and the plasma processing apparatus 10 including the edge ring 15 of the present embodiment, the content rate (=silicon/(quartz+silicon)) of the quartz and silicon in the edge ring 15 is reduced from 2.5% to 10% by weight. Thus, it is possible to reduce the remaining amount of the edge portion 2e of the mask 2 on the wafer W. As a result, the uniformity of the etching across the wafer W can be improved and the etch characteristics can be made uniform.

[Modifications]

Figure 5A:
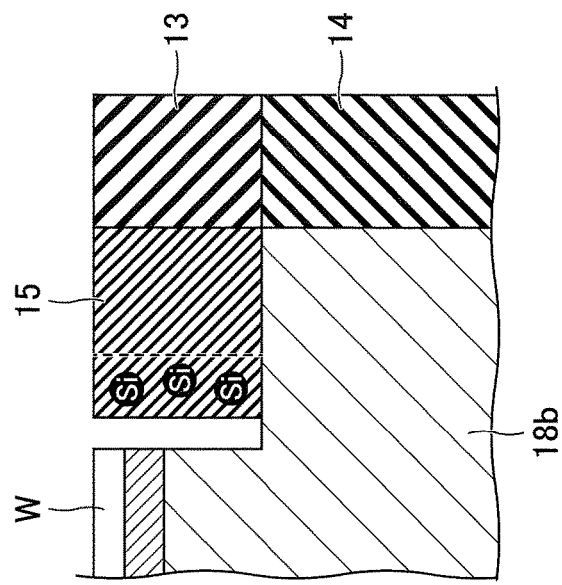
FIGS. 5A to 5D are diagrams illustrating an example of an edge ring or a cover ring according to a modification.
Figure 5B:
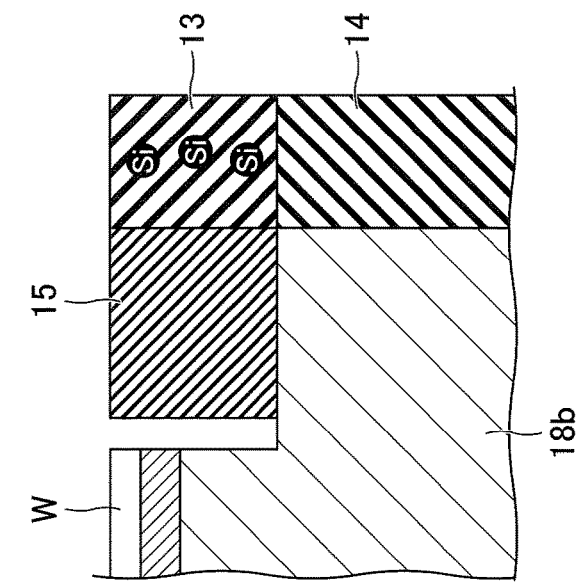

Finally, an example of an edge ring 15 or a cover ring 13 according to a modification of one embodiment will be described with reference to FIGS. 5A and 5B. FIGS. 5A and 5B are diagrams illustrating an example of an edge ring 15 and a cover ring 13 according to a modification of an embodiment.

In the above embodiments, the quartz edge ring 15 wholly contains Si. In contrast, the edge ring 15 according to the modification locally contains Si.

In an example of FIG. 5A, the edge ring 15 locally contains silicon in a region at a predetermined rate in the thickness direction from the top surface. The edge ring 15 is replaced when being consumed to a predetermined thickness. Accordingly, in the present modification, the edge ring 15 contains silicon in the upper half or at least 20-30% in the thickness direction from the top surface. Accordingly, silicon from the edge ring 15 before replacement can be efficiently deposited on the edge portion 2e, and the decrease in the remaining amount of the edge portion 2e can be reduced.

In an example of FIG. 5B, the edge ring 15 locally contains silicon in a region at a predetermined rate in a radial direction from the inner surface of the edge ring 15. Silicon peeled from the edge ring 15 is likely to adhere to the edge portion 2e from the inside of the edge ring closest to the edge portion 2e of the wafer W. Accordingly, in the present modification, the edge ring 15 contains silicon in the radially inner half of the edge ring 15 or at least 20 to 30% from the inside of the edge ring 15. Thus, a decrease in the remaining amount of the edge portion 2e of the mask 2 on the wafer W can be efficiently inhibited.

Figure 5C:
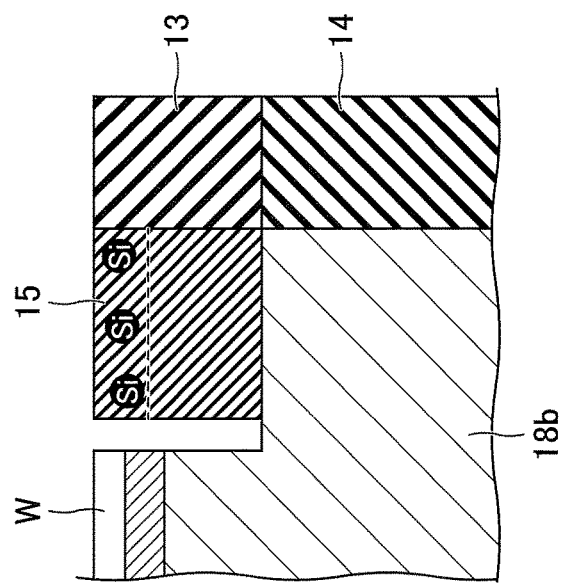
Figure 5D:
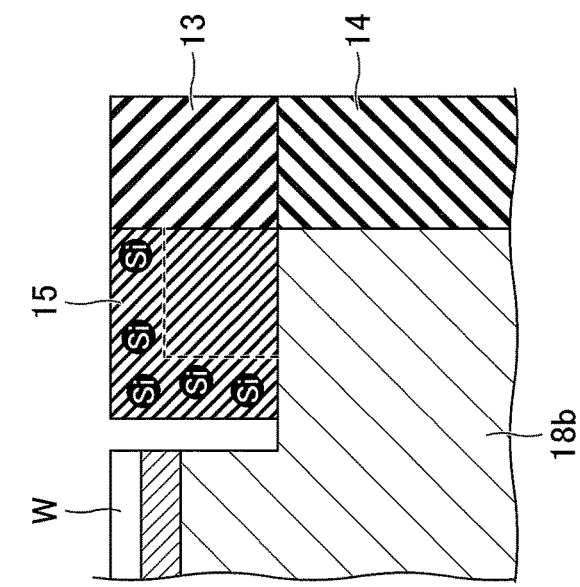

As illustrated in FIG. 5C, the edge ring 15 may contain silicon in the upper half of the edge ring 15 or at least 20 to 30% in the thickness direction from the top surface and in the inner half of the edge ring 15 in the radial direction or at least 20 to 30% from the inside of the edge ring 15.

In addition, the quartz cover ring 13 may be formed with a similar silicon content (=silicon/(quartz+silicon) at a weight percentage of 2.5% or more and 10% or less) to the edge ring 15. The cover ring 13 may also contain silicon locally as illustrated in FIGS. 5A to 5C. Both of the edge ring 15 and the cover ring 13 may be formed with a similar silicon content (=silicon/(quartz+silicon) by weight from 2.5% to 10% or less).

The edge ring 15 and the cover ring 13 are an example of an annular member disposed around the pedestal PD on which the wafer W is mounted to surround the wafer W. The annular member is a member with a content of silicon relative to quartz and silicon, that is, a percentage of the weight of silicon in the weight of quartz and silicon (by weight) of 2.5% and more and 10% and less.

The edge ring 15 or the cover ring 13 of the present embodiment and the modification may be manufactured by a 3D printer. In this case, a storage unit of the controller 80 stores three-dimensional data such that the edge ring 15 or the cover ring 13 of the quartz locally contains silicon at a predetermined content. The CPU may control the manufacture of the edge ring 15 by executing a control program for the 3D printer based on the 3D data stored in the storage unit. According to this, the edge ring 15 locally containing Si in quartz at a predetermined content in the upper portion and/or the inner region can be manufactured. In the meantime, the storage unit of the controller 80 may store stores three-dimensional data such that the edge ring 15 or the cover ring 13 of the quartz wholly contains silicon at a predetermined content. In this case, also, by causing the CPU to execute a control program for the 3D printer based on the 3D data stored in the storage unit, the edge ring 15 that wholly contains Si can be manufactured.

According to the embodiments, a decrease in remaining amount of an edge portion of a mask on a film to be etched can be inhibited.

The annular member, plasma processing apparatus, and plasma etching method according to one of the disclosed embodiments should be considered exemplary and should not be limited in all respects. The embodiments described above can be modified and improved in various forms without departing from the appended claims and the spirit thereof. The matters described in the above-described embodiments can be combined to a consistent extent with other configurations.

The processing device of the present disclosure is applicable to any type of Capacitively Coupled Plasma (CCP), Inductively Coupled Plasma (ICP), Radial Line Slot Antenna (RLSA), Electron Cyclotron Resonance Plasma (ECR), or Helicon Wave Plasma (HWP).

In this specification, wafers W have been described as an example of an object to be processed. However, the object to be processed may be a variety of substrates, printed circuit boards, and the like used in the FPD (Flat Panel Display).

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present disclosure have been described in detail, it should be understood that various changes, substitutions, and alterations could be made hereto without departing from the spirit and scope of the invention.

What is claimed is:

1. An annular member disposed to surround a pedestal for receiving a substrate in a plasma processing apparatus, the annular member comprising:

quartz formed integrally with a predetermined content percentage of silicon added to the quartz, wherein the added silicon is contained in the quartz, wherein the content percentage of the added silicon in the quartz and the added silicon is 2.5% to 10% by weight, and wherein the added silicon is locally contained from an inner radius to an outer radius of the annular member in an upper region of 20 to 50% from a top surface of the annular member in a thickness direction with respect to an entire thickness of the annular member.

2. The annular member according to claim 1, wherein the annular member is formed as an edge ring or a cover ring.

3. The annular member according to claim 1, wherein a film made of silicon, tungsten silicon or tungsten nitride silicon is formed on the substrate.

4. The annular member according to claim 1, wherein a mask formed on a film formed on the substrate is made of silicon oxide, tungsten silicon, or tungsten nitride silicon.

5. A plasma processing apparatus, comprising:
a processing chamber configured to process a substrate using plasma; a pedestal disposed in the processing chamber and configured to receive the substrate; and
an annular member disposed around the pedestal to surround the substrate in the process chamber,
wherein the annular member contains quartz formed integrally with a predetermined content percentage of silicon added to the quartz, wherein the added silicon is contained in the quartz, and
wherein the content percentage of the added silicon in the quartz and the added silicon is 2.5% to 10% by weight, and
wherein the added silicon is locally contained from an inner radius to an outer radius of the annular member in an upper region of 20 to 50% from a top surface of the annular member in a thickness direction with respect to an entire thickness of the annular member.

6. The plasma processing apparatus according to claim 5, wherein the annular member is formed as an edge ring or a cover ring.

7. The plasma processing apparatus according to claim 5, wherein a film made of silicon, tungsten silicon or tungsten nitride silicon is formed on the substrate.

8. The plasma processing apparatus according to claim 5, wherein a mask formed on a film formed on the substrate is made of silicon oxide, tungsten silicon, or tungsten nitride silicon.

* * * * *